United States Patent [19]
Kawan

[11] Patent Number: 5,837,153
[45] Date of Patent: Nov. 17, 1998

[54] METHOD AND SYSTEM FOR CREATING AND USING A LOGOTYPE CONTACT MODULE WITH A SMART CARD

[76] Inventor: Joseph C. Kawan, 2034 Paramount Dr., Hollywood, Calif. 90068

[21] Appl. No.: 784,262

[22] Filed: Jan. 15, 1997

[51] Int. Cl.⁶ ........................................................ B44C 1/22
[52] U.S. Cl. .................................. 216/2; 216/20; 283/83; 283/86; 283/91
[58] Field of Search ........................... 216/2, 20; 283/91, 283/86, 58, 83; 156/309.6

[56] References Cited

U.S. PATENT DOCUMENTS

| | | |
|---|---|---|
| 4,711,690 | 12/1987 | Haghiri-Tehrani . |
| 4,779,898 | 10/1988 | Berning et al. . |
| 5,251,937 | 10/1993 | Ojster ........................................ 283/91 |
| 5,383,687 | 1/1995 | Suess et al. . |
| 5,665,650 | 9/1997 | Lauffer et al. ............................. 216/20 |

FOREIGN PATENT DOCUMENTS 304015  8/1989  Rwanda .

OTHER PUBLICATIONS

Photocopy of Concept Card—*MasterCard International*, 1995.

"3–D Home Architect" Quick Start Card, 1993, p. 5.

*Primary Examiner*—Toni R. Scheiner
*Attorney, Agent, or Firm*—George T. Marcou; Kilpatrick Stockton LLP

[57] ABSTRACT

A method and system for providing specialized contacts for electronic information on a smart card in the pattern of a source identifier and such that a machine may contact and read the information upon placement of the card in a reading device. The contact points for reading information on the card are formed by etching a substrate attached to the logic element of the smart card. The etching allows both the foreground and the background of an image, in two selected colors, to be included within the contact area of the smart card, with the foreground constituting the conductor and the background the resist.

39 Claims, 4 Drawing Sheets

METHOD AND SYSTEM FOR CREATING AND USING A LOGOTYPE CONTACT MODULE WITH A SMART CARD

FIELD OF THE INVENTION

The present invention relates to the field of smart card technology. In particular, the invention provides a method and system for using a semiconductor chip in a smart card with contacts for use with a smart card reader in the pattern of a logotype.

BACKGROUND OF THE INVENTION

A smart card is the size and shape of a credit card but has a miniature computer. The miniature computer enables the smart card to perform numerous functions which otherwise could not be performed by a card with a magnetic strip. For example, a smart card may contain user identification data that prohibits unauthorized use. Security is accomplished by using sophisticated cryptographic techniques for communication between the smart card and reading devices. For general description, see, e.g., "Overview and Applications of Smart Card Technology," at http://www.vitro.bloomington.in.us:8080/20g4/smrtcard.html; Jose L. Zoreda & Jose Manuel Oton, Smart Cards, (Artech House, Inc. 1994).

A smart card typically contains a Self-Programmable One-Chip Microcomputer (SPOM) with eight metallic metal pads, usually copper, for electronic contact points for communication of data between the smart card and a reading device. The contact points provide power, an input/output for serial data communication, a connection for reading the smart card clock signal, a connection for resetting the smart card, and a connection for the programming voltage of the smart card. Thus, only six of the eight contact points are generally used by present smart cards on the market; the other two are reserved for future use.

The size, function, and location of these contacts are dictated by an industry standard. ISO 7816-2 and 7816-3. This enables the various manufacturers and users of smart cards to create cards and devices to work with cards that are all compatible with one another.

Smart cards generally contain Random Access Memory (RAM), Read Only Memory (ROM), and Electrically-Erasable Programmable Read Only Memory (EEPROM). The smart card processor typically has an 8-bit data path and 8-bit registers, and the card operates using an operating system selected for the particular application needs.

One aspect of smart cards is the method used for combining the appearance of the card and the need for contact points on the surface. Prior art includes printing verbiage and coloring the contacts with a process that may use either silk screen color or electroplated color. For example, a recently released Mastercard smart card consists of a chip module face with interlocking globes constructed of different contact materials, onto which were added a colored surface to produce letters and image outline.

SUMMARY OF THE INVENTION

This invention presents a method and system for combining images and words with the eight contact points of a smart card without using silk screen or electroplated color. In particular, the invention uses a single conductive surface, similar to a printed circuit board, from which a logotype is etched away, leaving the separated contact points.

Additional objects, advantages and novel features of the invention will be set forth in part in the description which follows, and in part will become more apparent to those skilled in the art upon examination of the following or may be learned by practice of the invention. The objects and advantages of the invention may be realized and attained by means of the instrumentalities and combinations particularly pointed out in the appended claims.

To achieve the stated and other objects of the present invention, as embodied and described below, the invention may comprise the steps of:

imprinting a pattern that includes a source identifier on a board having a substrate with conducting material on its surface;

etching away the conducting material in the pattern such that separated conducting contact points are created within the pattern;

attaching the substrate and etched conducting material to a semiconductor chip;

encapsulating the semiconductor chip; and emplacing the substrate, conducting material, and encapsulated semiconductor chip device in a cavity of a plastic frame.

DETAILED DESCRIPTION OF THE PREFERRED EMBODIMENT

A preferred embodiment of the invention uses a printed circuit board process in conjunction with the smart card chip module. A substrate with a contact material, such as copper, is used on the front surface of the smart card. The contact material is etched from this surface to conform to the standard contact points for a smart card reader. At the rear of the card, a semiconductor chip is pasted or glued in place and is either lead bonded to the contact plates, or a flip chip is used. With a flip chip, a semiconducting chip is flipped over and soldered directly to the contacts via feed through to the front surface.

Figure 1:
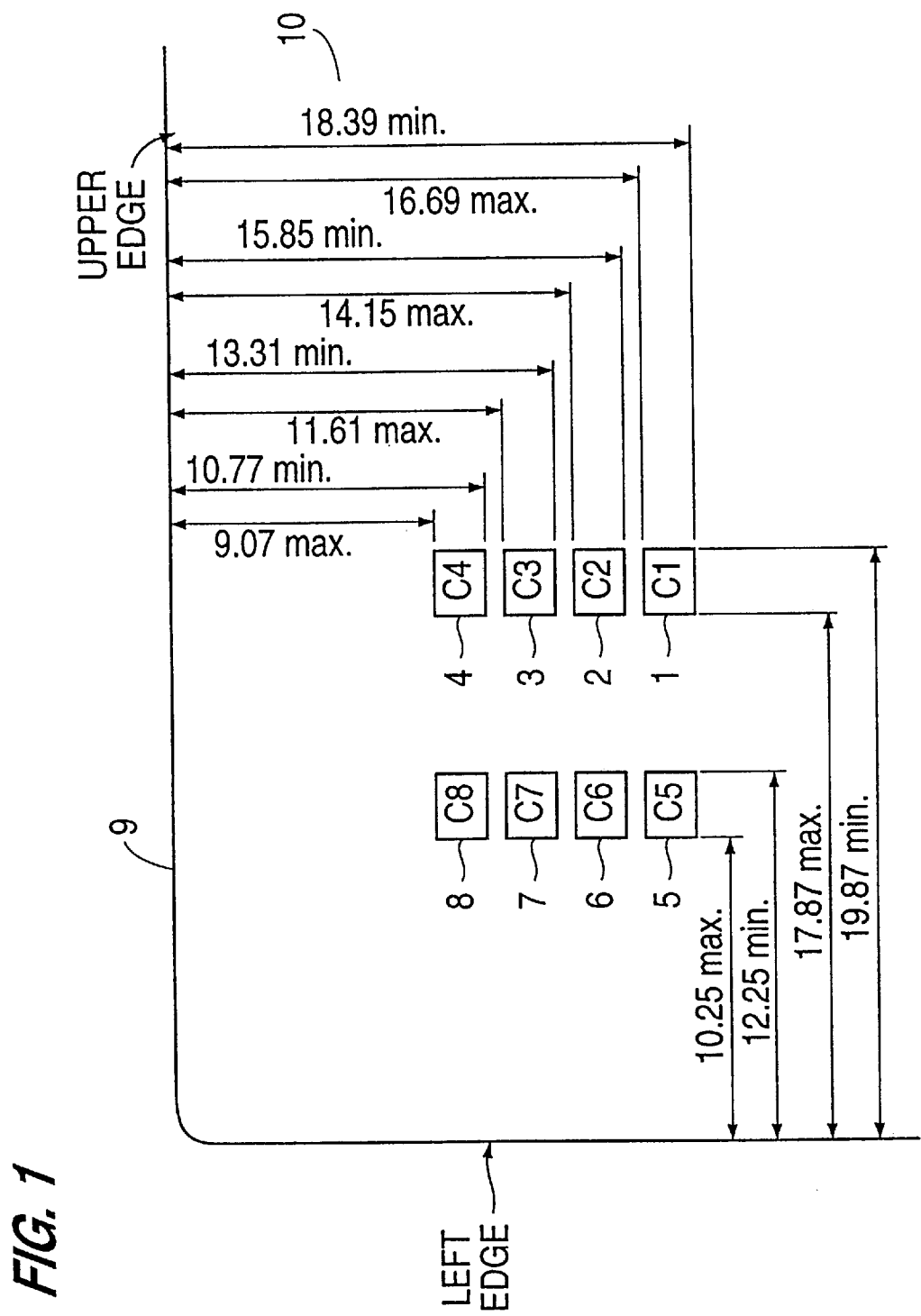
FIG. 1 is a diagram of the standard dimensions for smart card contact points.

As shown in FIG. 1, a standard exists for placement of the contact points 1 through 8 relative to the card edge 9. The contact points provide power 1 and ground 5, an input/output for serial data communication 7, a connection for reading the smart card clock signal 3, a connection for resetting the smart card 2, and a connection for the programming voltage of the smart card 6. Placement limits for the contact points is precisely measured 10 and 11 from the edge of the card 9.

Using a selected design for etching, the conductive surface is etched away leaving the substrate between the contacts. The substrate is usually a glass or epoxy board, which may be obtained in different colors, such as blueboard, greenboard, or blackboard. The substrate acts as an insulator between the contact points. This process avoids the printing of verbiage and coloring of contacts of prior art using either silk screen color or electroplated color. Thus, the secondary process of coloring the logotype material, which can cause registration problems with the smart card, are avoided.

Figure 2:
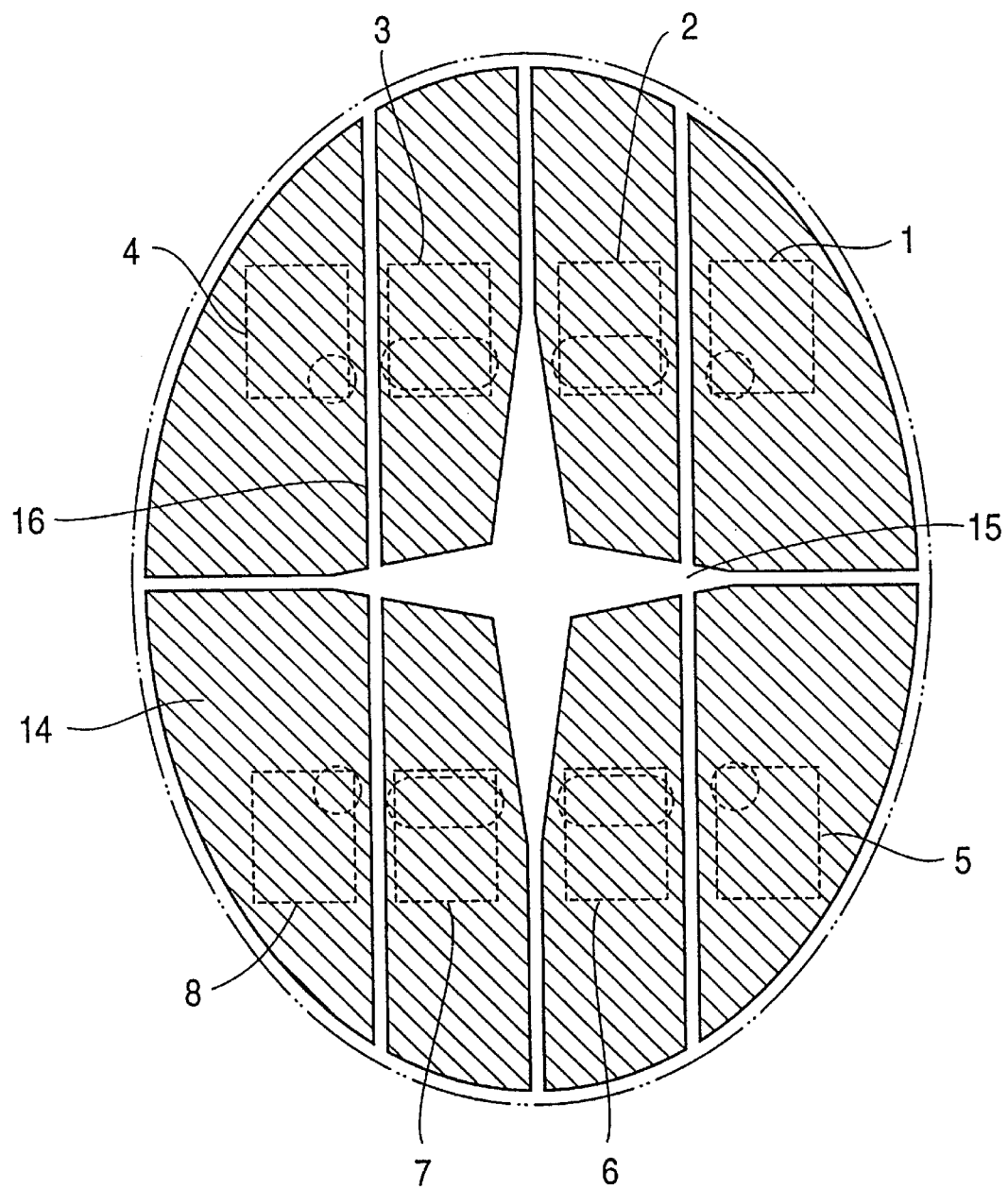
FIG. 2 is an example smart card logotype incorporating a preferred embodiment of the invention.

For example, for the Citibank logotype shown in FIG. 2, the process uses the image of a four-pointed star inside an oval background. Similarly, the logotype could include a square, circular, or rectangular background. The contacts 1 through 8 are connected to the surface metal in the area of the background of the star 14. This surface contact material is then etched away to expose the substrate 15. The boundaries between the contacts 16 are also etched away to isolate them from one another.

Figure 3:
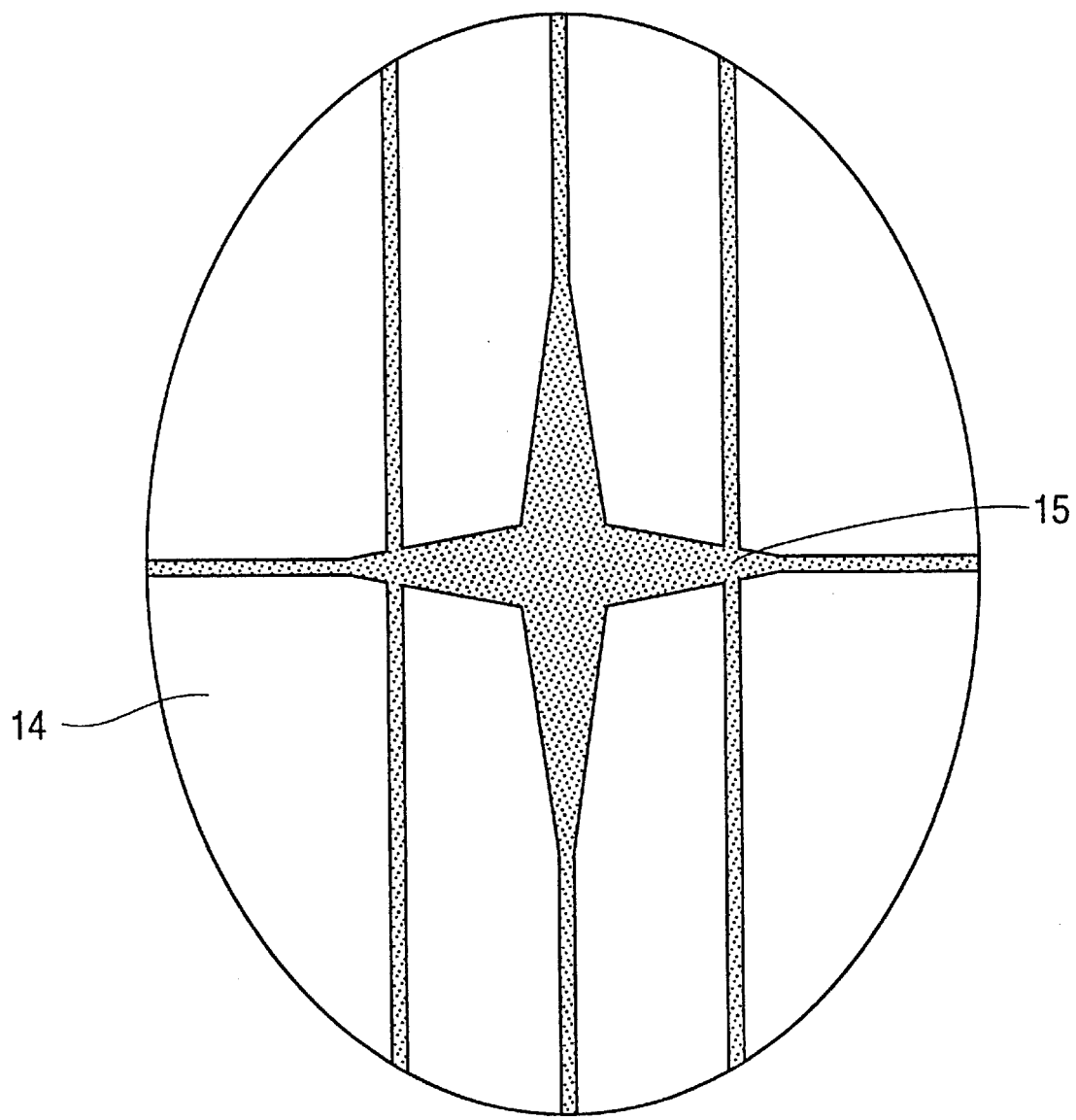
FIG. 3 is an example of the smart card logotype appearance after etching is completed.

Thus, the invention provides a methodology to obtain a low cost implementation for a logotype utilizing the substrate as the color without having to use a secondary process of coloring the logotype material. A preferred embodiment presents the final appearance shown in FIG. 3, with the background of the logotype 14 and the etched area 15 producing the star shape. This preferred embodiment thus eliminates a secondary process that could cause registration problems with the card.

In a preferred embodiment, the substrate technology is used to provide the color that represents the blue of the star, with the background consisting of the copper contacts that normally are gold, but that would be plated silver or gold depending on the type of card. In another preferred embodiment, a black substrate to represent the background of the oval would be used with gold plated contacts.

Fabrication

Another aspect of a preferred embodiment is the fabrication process used for this type of smart card. The chip module, which is essentially a tiny printed circuit board, for convenience and automation is made part of a tape or strip so that the chips can be precisely fed into position in a mechanism that is used to punch out the chip module. This chip module is then placed in a cavity in the smart card by a machine. This fabrication and emplacing includes an automated process.

The strip production comprises the following steps. The contacts are automatically registered in the chip module.

This involves attaching the smart card computer chip or semiconducting device, which could include a logic element or even a complete computer, through soldering or normal lead bonding to the contact locations. The chip is then encapsulated or otherwise provided with protection. Since the substrate is in a continuous strip, a resulting continuous strip of logotype chip modules are produced. The logotype modules are then punched from the strip for feeding into the smart card.

The smart card is physically similar to a credit card. A cavity is drilled into the smart card plastic in the same shape as the chip module. In a preferred embodiment, glue is put in place in the card and the chip module is punched out of the tape, placed in this cavity, and glued in place. In another preferred embodiment, a melt technology is used for inserting the chip module into the card.

In terms of the circuit board process, a very thin substrate is used with copper with silver plating or another conductive material on top of the substrate. A standard circuit board type etching takes place on the surface in which the resist is put down onto the copper and a negative photographically developed image of the desired logotype shape and contact is exposed. In a preferred embodiment, the image includes eight contacts on the board in the background of the image and the resist in the foreground.

Figure 4:
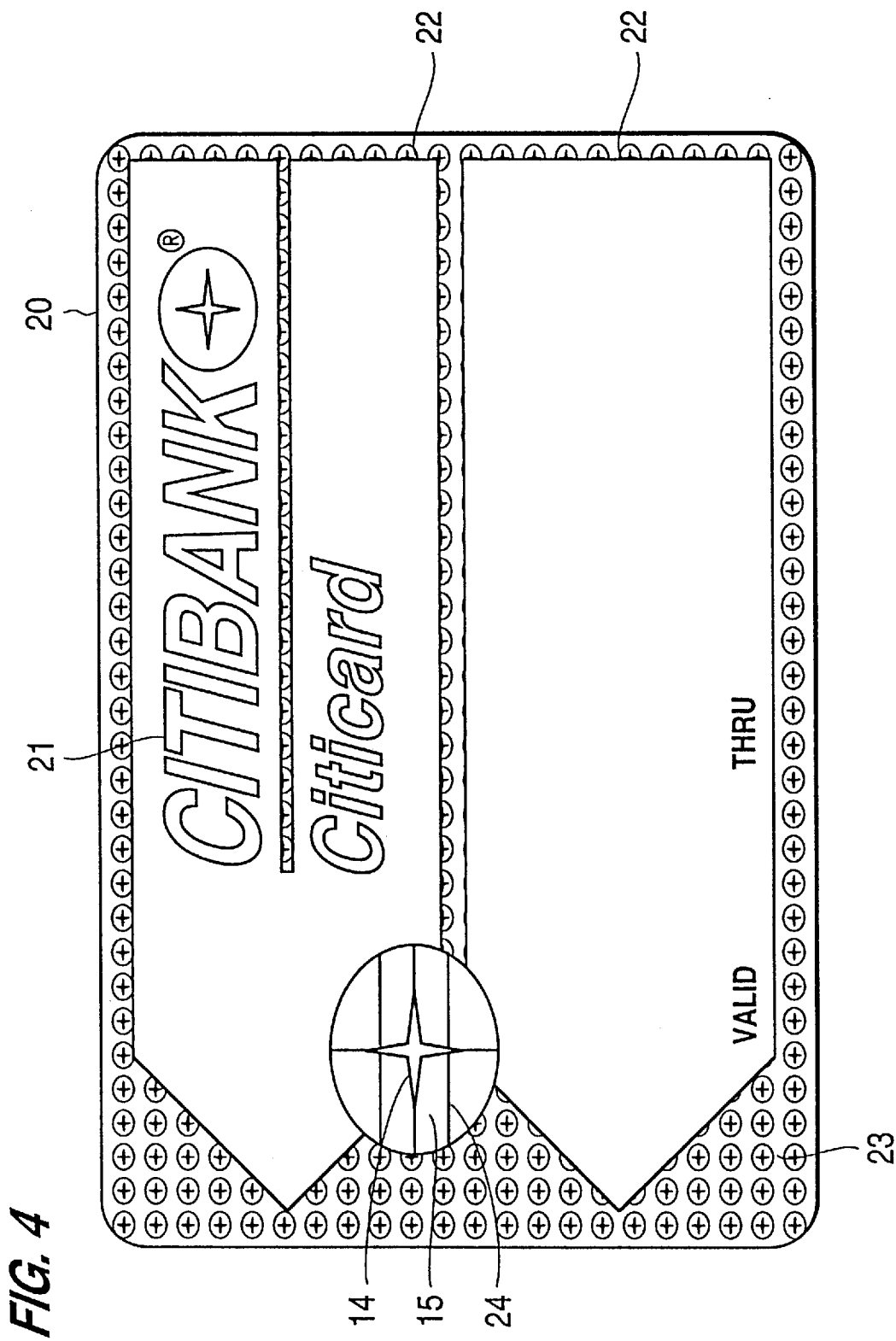
FIG. 4 is an example of a smart card appearance with the logotype chip module in place.

The final appearance of a preferred embodiment is shown in FIG. 4. The smart card 20 contains printed words 21, shading 22 and background pattern 23 comprising ink on the plastic part of the card 20. The logotype 24 with contact material 14 and exposed substrate 15 is positioned so as to be properly readable by smart card reader.

What is claimed is:

1. A method for creating a contact surface for a smart card comprising:

imprinting a pattern comprising a source identifier on a board comprising a substrate with conducting material on its surface;

etching away a portion of the conducting material in the pattern such that separated conducting contact points are created within said pattern;

attaching said substrate and etched conducting material to a semiconductor chip such that the conducting contact points are electrically connected to the semiconductor chip;

encapsulating the semiconductor chip; and emplacing said substrate, conducting material, and encapsulated semiconductor chip device in a cavity of a plastic frame.

2. The method of claim 1 wherein said imprinting comprises photoimaging.

3. The method of claim 1 wherein said pattern comprises an oval logotype.

4. The method of claim 1 wherein said pattern comprises a square logotype.

5. The method of claim 1 wherein said pattern comprises a rectangular logotype.

6. The method of claim 1 wherein said pattern comprises a circular logotype.

7. The method of claim 1 wherein said board comprises a circuit board.

8. The method of claim 1 wherein said substrate comprises a fiberglass board.

9. The method of claim 1 wherein said substrate comprises an epoxy board.

10. The method of claim 1 wherein said substrate comprises greenboard.

11. The method of claim 1 wherein said substrate comprises blackboard.

12. The method of claim 1 wherein said substrate comprises blueboard.

13. The method of claim 1 wherein said conducting material comprises a copper surface.

14. The method of claim 1 wherein said conducting material comprises a copper surface with silver plating.

15. The method of claim 1 wherein said conducting material comprises a copper surface with gold plating.

16. The method of claim 1 wherein said source identifier comprises a logotype.

17. The method of claim 1 wherein said attachment is performed by soldering.

18. The method of claim 1 wherein said attachment is performed by lead bonding.

19. The method of claim 1 wherein said emplacement is performed by gluing.

20. The method of claim 1 wherein said plastic frame is of the size and shape of a standard credit card.

21. A system for providing a smart card comprising:

a board comprising a substrate with etched conducting material on its surface attached to a semiconductor chip, said etched conducting material forming a pattern including a source identifier and a plurality of contact points where the plurality of contact points are used for making at least one electrical connection to the semiconductor chip, said semiconductor chip is then encapsulated; and a plastic frame with a cavity in which is emplaced said board and attached encapsulated semiconductor chip.

22. The system of claim 21 wherein said board comprises a circuit board.

23. The system of claim 17 wherein said substrate comprises a fiberglass board.

24. The system of claim 21 wherein said substrate comprises an epoxy board.

25. The system of claim 21 wherein said substrate comprises greenboard.

26. The system of claim 21 wherein said substrate comprises blackboard.

27. The system of claim 21 wherein said substrate comprises blueboard.

28. The system of claim 21 wherein said conducting material comprises a copper surface.

29. The system of claim 21 wherein said conducting material comprises a copper surface with silver plating.

30. The system of claim 21 wherein said conducting material comprises a copper surface with gold plating.

31. The system of claim 21 wherein said source identifier comprises a logotype.

32. The system of claim 21 wherein said pattern comprises an oval logotype.

33. The system of claim 21 wherein said pattern comprises a square logotype.

34. The system of claim 21 wherein said pattern comprises a rectangular.

35. The system of claim 21 wherein said pattern comprises a circular logotype.

36. The system of claim 21 wherein said attachment is performed by soldering.

37. The system of claim 21 wherein said attachment is performed by lead bonding.

38. The system of claim 21 wherein said emplacement is performed by gluing.

39. The system of claim 21 wherein said plastic frame is of the size and shape of a standard credit card.

* * * * *